US012722206B2

(12) United States Patent
Von Fieandt et al.

(10) Patent No.: US 12,722,206 B2
(45) Date of Patent: Sep. 1, 2026

(54) COATED CUTTING TOOL

(71) Applicant: AB SANDVIK COROMANT, Sandviken (SE)

(72) Inventors: Linus Von Fieandt, Uppsala (SE); Raluca Morjan Brenning, Uppsala (SE); Jan Engqvist, Uppsala (SE)

(73) Assignee: AB Sandvik Coromant, Sandviken (SE)

( * ) Notice: Subject to any disclaimer, the term of this patent is extended or adjusted under 35 U.S.C. 154(b) by 897 days.

(21) Appl. No.: 17/613,213

(22) PCT Filed: May 26, 2020

(86) PCT No.: PCT/EP2020/064540
§ 371 (c)(1),
(2) Date: Nov. 22, 2021

(87) PCT Pub. No.: WO2020/239747
PCT Pub. Date: Dec. 3, 2020

(65) Prior Publication Data

US 2022/0219244 A1 Jul. 14, 2022

(30) Foreign Application Priority Data

May 27, 2019 (EP) .................................... 19176704

(51) Int. Cl.
*B23B 27/14* (2006.01)
*C22C 29/08* (2006.01)
(Continued)

(52) U.S. Cl.
CPC .............. *B23B 27/14* (2013.01); *C22C 29/08* (2013.01); *C23C 16/303* (2013.01); *C23C 16/36* (2013.01);
(Continued)

(58) Field of Classification Search
CPC ...................................................... C23C 16/34
See application file for complete search history.

(56) References Cited

U.S. PATENT DOCUMENTS 7,510,760 B2 * 3/2009 Malshe .................. C23C 24/00 428/408
2008/0057280 A1 * 3/2008 Watanabe .............. C23C 16/36 427/255.28

(Continued)

FOREIGN PATENT DOCUMENTS

KR 1020190018639 A 2/2019
KR 1020190024896 A 3/2019

OTHER PUBLICATIONS

Toller Lisa et al; "Investigation of cemented carbides with alternative binders after CVD coating", International Journal of Refractory Metals and Hard Metals, Elsevier, Amsterdam, NL. vol. 62, Jul. 5, 2016, pp. 225-229.

(Continued)

*Primary Examiner* — Kelly M Gambetta
(74) *Attorney, Agent, or Firm* — Corinne R. Gorski

(57) ABSTRACT

A coated cutting tool is provided. The cutting tool is CVD coated and has a substrate of cemented carbide, wherein a metallic binder in the cemented carbide includes Ni. The CVD coating has an inner layer of TiN and a subsequent layer of TiCN and a layer of $Al_2O_3$ located between the TiCN layer and an outermost surface of the coated cutting tool.

5 Claims, 6 Drawing Sheets

(51) Int. Cl.
*C23C 16/30* (2006.01)
*C23C 16/36* (2006.01)
*C23C 16/40* (2006.01)
*C23C 28/04* (2006.01)

(52) U.S. Cl.
CPC .......... *C23C 16/403* (2013.01); *C23C 28/044* (2013.01); *B23B 2224/04* (2013.01); *B23B 2224/32* (2013.01); *B23B 2224/36* (2013.01)

(56) References Cited

U.S. PATENT DOCUMENTS

2013/0216777 A1* 8/2013 Jiang ........................ C23C 16/36
977/773
2018/0002817 A1* 1/2018 Lindahl .................... C23C 30/00
2018/0029118 A1* 2/2018 Gries ....................... C22C 29/06

OTHER PUBLICATIONS

Von Fieandt L et al.: "Chemical vapor deposition of TiN on transition metal substrates", Surfaces and Coatings Technology, vol. 334, Jan. 2, 2017, pp. 373-383.

Zhixing Guo et al: "Adherent Ti (C,N) Coatings on Cemented Carbide Substrates with Fe/Ni/Co Binder", Metallurgical and Materials Transactions B, Springer-Verlag, New York, vol. 40, No. 6, Aug. 26, 2009, pp. 871-876.

* cited by examiner

COATED CUTTING TOOL

RELATED APPLICATION DATA

This application is a § 371 National Stage Application of PCT International Application No. PCT/EP2020/064540 filed May 26, 2020 claiming priority to EP 19176704.5 filed May 27, 2019. This application is related to co-pending U.S. patent application Ser. No. 18/563,571, filed on Nov. 22, 2023, U.S. Pat. No. 18,563,612, filed on Nov. 22, 2023, Ser. No. 18/563,474, filed on Nov. 22, 2023, and Ser. No. 18/563,259, filed on Nov. 21, 2023.

TECHNICAL FIELD

The present invention relates to a coated cutting tool. The cutting tool is CVD coated and the substrate is a cemented carbide wherein the metallic binder in the cemented carbide comprises Ni. The CVD coating comprises an inner layer of TiN, a layer of TiCN and a layer of $Al_2O_3$.

BACKGROUND

The market of cutting tools for chip forming metal cutting operations is dominated by CVD (Chemical Vapor Deposition) and PVD (Physical Vapor Deposition) coated cemented carbides wherein the cemented carbide is usually made of WC in a metallic binder of Co.

Alternative binders without Co or reduced amount of Co are being developed but are still rare or non-existing in the products on the market. It is not only the production of the cemented carbide itself, it is also the coating of the cemented carbide that is demanding since interactions occur between the gas phase and the cemented carbide, especially during chemical vapor deposition which is performed using reactive gasses at high temperature.

Among the alternative metallic binders a mixture of Ni and Fe is a promising candidate: these two elements are placed at each side of Co in the periodic table. Ni shows a high reactivity with Ti and a high amount of Ni in the cemented carbide causes problems in chemical vapor deposition of a Ti-containing coating since intermetallic phases such as $Ni_3Ti$ forms at the interface between the cemented carbide and the coating and in the coating. Intermetallic phases such as $Ni_3Ti$ at the interface or in the lower part of the Ti-containing coating reduces the coating adhesion and negatively influence the wear resistance of a coating subsequently deposited on the Ti-containing coating.

The problem of the formation of $Ni_3Ti$ during deposition of a TiN coating on Ni metal substrates is analyzed in “Chemical vapor deposition of TiN on transition metal substrates” by L. von Fieandt et al, Surface and Coatings Technology 334 (2018) 373-383. It was concluded that the formation of $Ni_3Ti$ could be reduced by an excess of $N_2$ partial pressure and low $H_2$ partial pressure during the CVD process.

It is an object of the present invention to provide a method of depositing a cutting tool with Ni containing cemented carbide substrate with a wear resistant CVD coating that can compete with Co containing cemented carbide substrates. It is a further object to provide a method of depositing a wear resistant coating comprising a TiN layer and a TiCN layer on cemented carbide containing Ni. It is also an object to provide a method of depositing a coating comprising a layer of $Al_2O_3$, preferably a 001 oriented $\alpha$-$Al_2O_3$, on a Ni containing cemented carbide substrate, especially a substrate containing a metallic binder with more than 60 wt % Ni.

DESCRIPTION OF THE INVENTION

The method of making a cutting tool in accordance with the present invention comprises deposition of a CVD coating on a substrate, said CVD coating comprising an inner layer of TiN, a subsequent layer of TiCN and a $Al_2O_3$ layer located between the TiCN layer and an outermost surface of the coated cutting tool, wherein the substrate is made of cemented carbide composed of hard constituents in a metallic binder and wherein the metallic binder comprises 60 to 90 wt % Ni, wherein the TiN layer is deposited on the cemented carbide substrate in two subsequent steps at 850-900° C., preferably 870-900° C., and a pressure of about 300-600 mbar, preferably 300-500 mbar: a first TiN deposition of TiN-1, followed by a second TiN deposition of TiN-2, the TiN-1 deposition is performed in a gas comprising 1-1.5 vol % $TiCl_4$ and $H_2$ and $N_2$, wherein the volume ratio $H_2/N_2$ is 0.05-0.18, preferably 0.09-0.14, and wherein the gas preferably comprises 0.5-1.5 vol % HCl, more preferably 0.8-1.0 vol % HCl, and the TiN-2 deposition is performed in a gas comprising 2-3 vol % $TiCl_4$ and $H_2$ and $N_2$, wherein the volume ratio $H_2/N_2$ is 0.8-2.5, preferably 0.9-1.7, more preferably 0.9-1.2.

It was realized that when making a TiN deposition comprising two steps with different gas compositions, a successful TiN CVD layer could be deposited on substrates containing 60-90 wt % Ni. Higher amounts of $N_2$ in the first TiN deposition step prevents intermetallic phases such as $Ni_3Ti$ from forming at the interface between the substrate and the TiN layer and in the inner part of the TiN layer. However, a TiN layer deposited under these conditions exhibited a texture that was not advantageous. A subsequent TiCN layer deposited on this TiN layer did not exhibit the desired grain size or texture. Deposition of TiN under conditions with high volume ratio $H_2/N_2$ was shown to be successful on the conventional cemented carbide substrate with a binder of Co and the TiN formed showed a high adhesion to the substrate and a promising starting layer for subsequent layers such as TiCN. But on Ni containing substrate this is not successful since intermetallic phases such as $Ni_3Ti$ are formed. It has now been found that a TiN layer with both high adhesion and with the right properties to obtain a fine grained subsequent TiCN layer on a Ni containing cemented carbide can be provided by depositing the TiN layer with a process comprising two steps: a first step with a lower volume ratio $H_2/N_2$ and a second step with a higher volume ratio $H_2/N_2$.

The change from the first process condition to the second process condition can be done step-wise or continuous.

In one embodiment of the method of the present invention the method further comprises TiCN deposition in two subsequent steps at a temperature of about 875-895° C. and a pressure of about 50-70 mbar: a first deposition of TiCN, followed by a second deposition of TiCN, the first TiCN deposition is performed in gas comprising 55-65 vol % $H_2$, 35-40 vol % $N_2$, 2.8-3.1 vol % $TiCl_4$ and 0.4-0.5 vol % $CH_3CN$, and the second TiCN deposition is performed in a gas comprising 75-85 vol % $H_2$, 6-9 vol % $N_2$, 2.3-2.5 vol % $TiCl_4$, 0.6-0.7 vol % $CH_3CN$ and 7-9 vol % HCl.

In one embodiment of the method of the present invention the metallic binder comprises 60-90 wt % Ni, preferably 65-88 wt % Ni, more preferably 70-87 wt % Ni, even more preferably 75-85 wt % Ni.

In one embodiment of the method of the present invention the metallic binder comprises 10-20 wt % Fe, preferably 10-15 wt % Fe.

In one embodiment of the method of the present invention the metallic binder comprises 3-8 wt % Co, preferably 5-6 wt % Co.

In one embodiment of the method of the present invention the metallic binder content in the cemented carbide is 3-20 wt %, preferably 5-15 wt %, more preferably 5-10 wt %.

In one embodiment of the method of the present invention the thickness of the TiN layer is 0.3-1 μm, preferably deposited directly on the cemented carbide substrate.

In one embodiment of the method of the present invention the total thickness of the CVD coating is 2-20 μm.

In one embodiment of the method of the present invention the CVD coating further comprises one or more layers selected from TiN, TiCN, AlTiN, ZrCN, $TiB_2$, $Al_2O_3$, or multilayers comprising $\alpha$-$Al_2O_3$ and/or $\kappa$-$Al_2O_3$.

In one embodiment of the method of the present invention the CVD coating further comprises a layer of $Al_2O_3$ deposited subsequent to the TiCN layer, preferably an $\alpha$-$Al_2O_3$ layer or an $\kappa$-$Al_2O_3$.

In one embodiment of the method of the present invention the method further comprises deposition of a layer of $Al_2O_3$ between the TiCN layer and an outermost surface of the coated cutting tool, said deposition of $Al_2O_3$ is performed in at least two steps, both steps at a temperature of 980-1020° C. and a pressure of 50-60 mbar, wherein a first step is performed in a gas composition of 1.1-1.3 vol % AlCl3, 4.5-5 vol % CO2, 1.6-2.0 vol % HCl and the rest H2, and wherein a subsequent second step is performed in a gas composition of 1.1-1.3 vol % AlCl3, 4.5-5 vol % CO2, 2.8-3.0 vol % HCl, 0.55-0.6 vol % H2S and the rest H2.

The present invention also relates to a coated cutting tool comprising a cemented carbide substrate and a CVD coating, wherein the cemented carbide is composed of hard constituents in a metallic binder and wherein said metallic binder comprises 60 to 90 wt % Ni, and wherein the CVD coating comprises an inner TiN layer, a TiCN layer and a $Al_2O_3$ layer, said $Al_2O_3$ layer being located between the TiCN layer and an outermost surface of the coated cutting tool, wherein the TiCN is composed of crystal grains and wherein the grain size of the TiCN layer as measured along a line in a direction parallel to the surface of the substrate at a position of 1 μm from the TiN layer is about 0.10-0.30 μm, preferably 0.15-0.27 μm.

Coated cutting tools according to the present invention have surprisingly shown fever pores at the inner part of the coating and this is promising for a wear resistant coating aimed for metal cutting applications. The new method as disclosed above have made it possible to produce an inner TiN layer and a subsequent TiCN layer on the Ni-containing substrate without intermetallic phases disturbing growth. It has proven to be possible to provide a TiN layer and a subsequent fine grained columnar TiCN layer even on substrates with a Ni in the binder. The TiCN of the present invention is a layer comparable to a TiCN deposited on cemented carbide with Co binder. The new layer shows improved properties relating to the formation of intermetallic phases, pores and disturbances relating to the orientation of the layer and subsequently deposited layers. Technical effects can be increased flank wear resistance and/or increased flaking resistance and/or increased crater wear resistance in metal cutting operations of for example steel.

In one embodiment of the coated cutting tool of the present invention the metallic binder comprises 60-90 wt % Ni, preferably 65-88 wt % Ni, more preferably 70-87 wt % Ni, even more preferably 75-85 wt % Ni.

In one embodiment of the coated cutting tool of the present invention the metallic binder comprises 10-20 wt % Fe, preferably 10-15 wt % Fe.

In one embodiment of the coated cutting tool of the present invention the metallic binder comprises 3-8 wt % Co, preferably 5-6 wt % Co.

In one embodiment of the coated cutting tool of the present invention the metallic binder content in the cemented carbide is 3-20 wt %, preferably 5-15 wt %, most preferably 5-10 wt %.

In one embodiment of the coated cutting tool of the present invention the thickness of the TiN layer is 0.3-1 μm, preferably deposited directly on the cemented carbide substrate.

In one embodiment of the coated cutting tool of the present invention the TiCN layer exhibits a texture coefficient TC(hkl), as measured by X-ray diffraction using CuKα radiation and θ-2θ scan, defined according to Harris formula $$TC(hkl) = \frac{I(hkl)}{I_0(hkl)}\left[\frac{1}{n}\sum_{n=1}^{n}\frac{I(hkl)}{I_0(hkl)}\right]^{-1} \quad (1)$$

where I(hkl) is the measured intensity (integrated area) of the (hkl) reflection, $I_0$(hkl) is the standard intensity according to ICDD's PDF-card No 42-1489, n is the number of reflections, reflections used in the calculation are (1 1 1), (2 0 0), (2 2 0), (3 1 1), (3 3 1), (4 2 0), (4 2 2) and (5 1 1), wherein TC(4 2 2) is ≥3.5.

In one embodiment of the coated cutting tool of the present invention the thickness of the TiCN layer is 6-12 μm.

In one embodiment of the coated cutting tool of the present invention the total thickness of the CVD coating is 2-20 μm.

In one embodiment of the coated cutting tool of the present invention the CVD coating further comprises one or more layers selected from TiN, TiCN, AlTiN, ZrCN, $TiB_2$, $Al_2O_3$, or multilayers comprising $\alpha$-$Al_2O_3$ and/or $\kappa$-$Al_2O_3$.

In one embodiment of the coated cutting tool of the present invention the $Al_2O_3$ layer between the TiCN layer and an outermost surface of the coated cutting tool is an $\alpha$-$Al_2O_3$ layer.

In one embodiment of the coated cutting tool of the present invention said $\alpha$-$Al_2O_3$ layer exhibits a texture coefficient TC(hkl), as measured by X-ray diffraction using Cukα radiation and θ-2θ scan, defined according to Harris formula where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12), wherein TC(0 0 12)≥6, preferably ≥7.

In one embodiment of the coated cutting tool of the present invention the $Al_2O_3$ layer exhibits a intensity ratio I(0 0 12)/I(0 1 14) of ≥0.8, preferably ≥1.

In one embodiment of the coated cutting tool of the present invention the thickness of the $Al_2O_3$ layer located between the TiCN layer and an outermost surface of the coated cutting tool is 4-8 μm.

METHODS

Coating Deposition

The coatings in the examples below were deposited in a radial Ionbond Bernex TM type CVD equipment 530 size capable of housing 10000 half-inch size cutting inserts.

X-ray Diffraction Measurement

In order to investigate the texture of the layer(s) X-ray diffraction was conducted on the flank face of cutting tool inserts using a PANalytical CubiX3 diffractometer equipped with a PIXcel detector. The coated cutting tool inserts were mounted in sample holders to ensure that the flank face of the cutting tool inserts is parallel to the reference surface of the sample holder and also that the flank face was at appropriate height. Cu-K$\alpha$ radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu-$K_{\alpha2}$ stripping and profile fitting of the data, was done using PANalytical's X'Pert HighScore Plus software. A general description of the fitting is made in the following. The output (integrated peak areas for the profile fitted curve) from this program was then used to calculate the texture coefficients of the layer by comparing the ratio of the measured intensity data to the standard intensity data according to a PDF-card of the specific layer (such as a layer of TiCN or $\alpha$-$Al_2O_3$), using the Harris formula (1) as disclosed above. Since the layer is finitely thick the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the $\alpha$-$Al_2O_3$ layer will affect the X-ray intensities entering the $\alpha$-$Al_2O_3$ layer and exiting the whole coating, corrections need to be made for these as well, taken into account the linear absorption coefficient for the respective compound in a layer. The same applies for X-ray diffraction measurements of a TiCN layer if the TiCN layer is located below for example an $\alpha$-$Al_2O_3$ layer. Alternatively, a further layer, such as TiN, above an alumina layer can be removed by a method that does not substantially influence the XRD measurement results, e.g. chemical etching.

In order to investigate the texture of the $\alpha$-$Al_2O_3$ layer X-ray diffraction was conducted using $CuK_\alpha$ radiation and texture coefficients TC (hkl) for different growth directions of the columnar grains of the $\alpha$-$Al_2O_3$ layer were calculated according to Harris formula (1), where I(hkl)=measured (integrated area) intensity of the (hkl) reflection, $I_0$(hkl) =standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12). In the calculation of the ratio I(0 0 12)/I(0 1 14) the integrated peak area intensity of the (0 0 12) peak and the (0 1 14) peak were divided, independently of any PDF-card. The measured integrated peak area is thin film corrected and corrected for any further layers above (i.e. on top of) the $\alpha$-$Al_2O_3$ layer before said ratio is calculated.

The texture coefficients TC (hkl) for different growth directions of the columnar grains of the TiCN layer were calculated according to Harris formula (1) as disclosed earlier, where I(hkl) is the measured (integrated area) intensity of the (hkl) reflection, $I_0$(hkl) is the standard intensity according to ICDD's PDF-card no 42-1489, n is the number of reflections to be used in the calculation. In this case the (hkl) reflections used are (1 1 1), (2 0 0), (2 2 0), (3 1 1), (3 3 1), (4 2 0), (4 2 2) and (5 1 1).

It is to be noted that peak overlap is a phenomenon that can occur in X-ray diffraction analysis of coatings comprising for example several crystalline layers and/or that are deposited on a substrate comprising crystalline phases, and this has to be considered and compensated for. A overlap of peaks from the $\alpha$-$Al_2O_3$ layer with peaks from the TiCN layer might influence measurement and needs to be considered. It is also to be noted that for example WC in the substrate can have diffraction peaks close to the relevant peaks of the present invention.

BRIEF DESCRIPTION OF DRAWINGS

Embodiments of the invention will be described with reference to the accompanying drawings, wherein.

EXAMPLES

Figure 1:
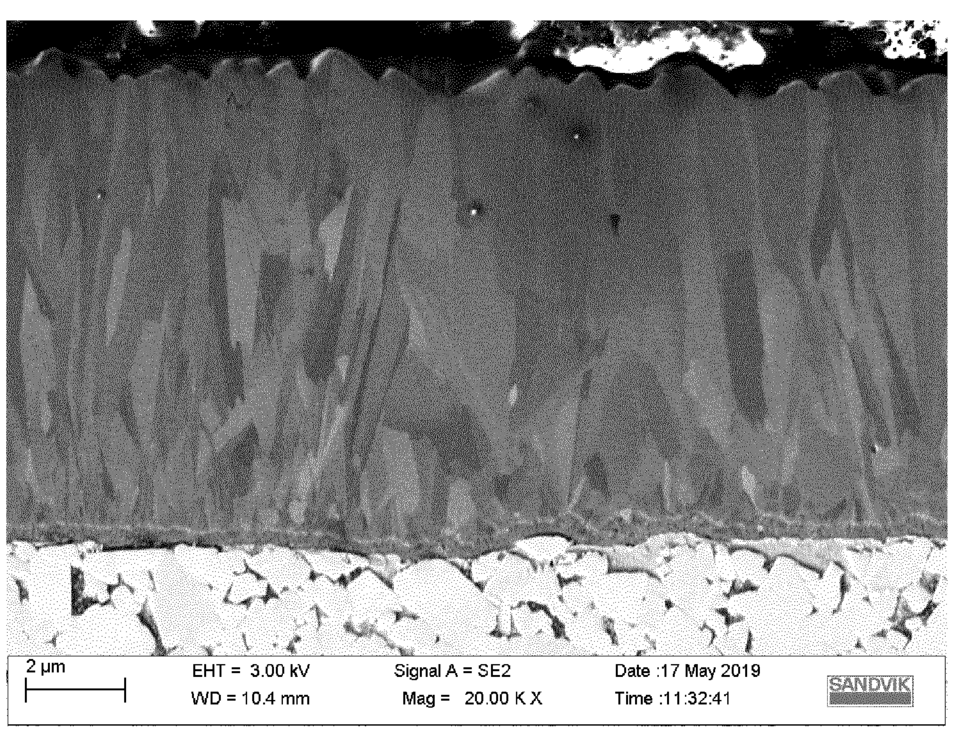
FIG. 1 is a cross-sectional SEM micrograph showing the TiN layer and the TiCN layer of a coated cutting tool according to one embodiment of the invention (Invention 1), the grain size in the TiCN can be measured in this view.
Figure 2:
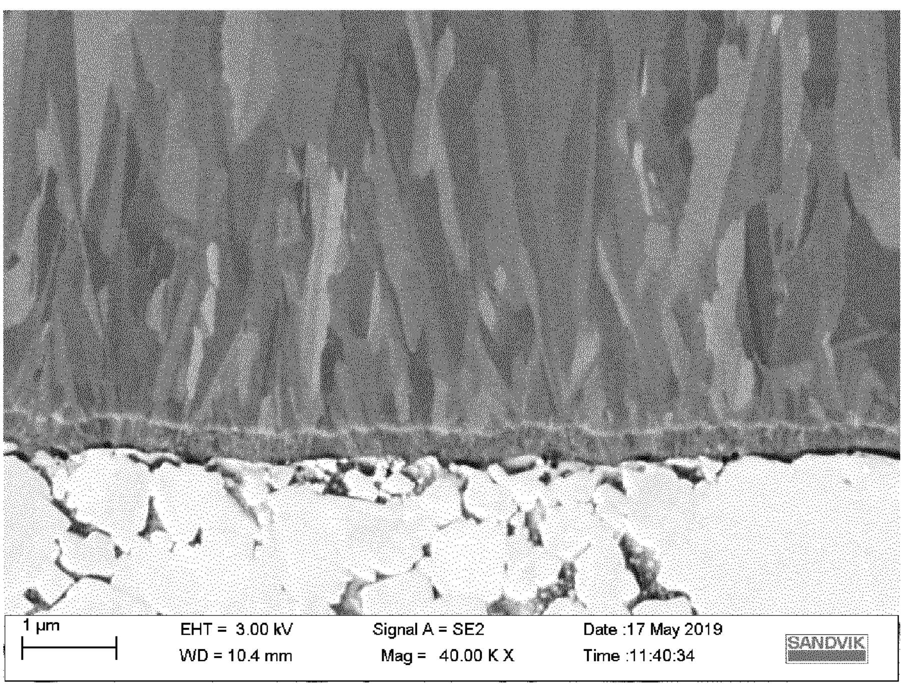
FIG. 2 is a close-up of the TiN layer and the lower part of the TiCN layer of the coated cutting tool shown in FIG. 1.
Figure 3:
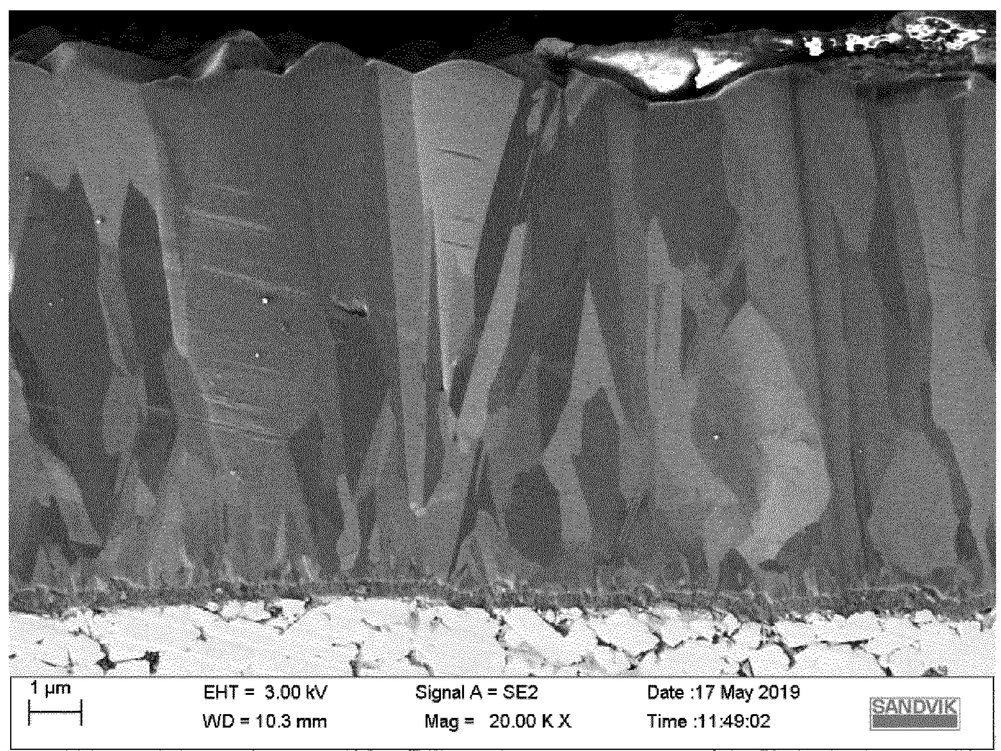
FIG. 3 is a cross-sectional SEM micrograph showing the TiN layer and the TiCN layer of a reference coated cutting tool (Reference 1B), the grain size in the TiCN can be measured in this view.
Figure 4:
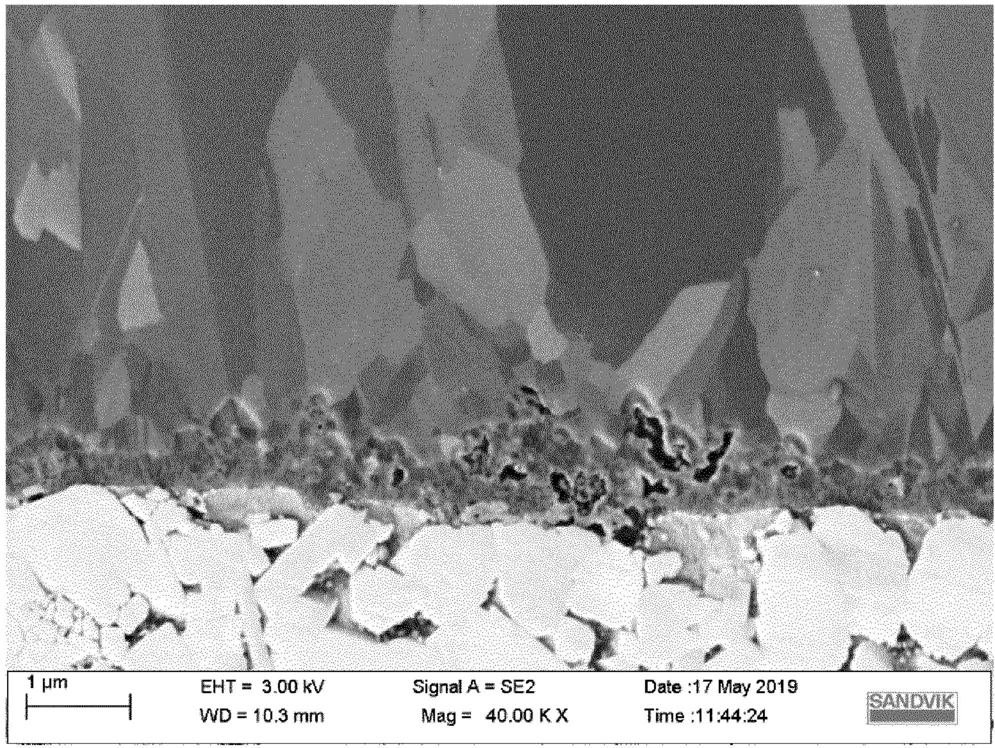
FIG. 4 is a close-up of the TiN layer and the lower part of the TiCN layer of the coated cutting tool shown in FIG. 2, pores are visible as dark spots inside the coating and at the substrate-coating interface.

Exemplifying embodiments of the present invention will now be disclosed in more detail and compared to reference embodiments. Coated cutting tools (inserts) were manufactured and analysed.

Substrates

Cemented carbide substrates of ISO-type CNMG120408 for turning and of ISO-type SNMA120408 were manufactured.

Cemented carbide substrates with an alternative binder were manufactured with a binder comprising about 80.7 wt % Ni, 13.7 wt % Fe and 5.6 wt % Co. The binder content in the cemented carbide was about 7 wt %. The cemented carbide substrates with the alternative binder were manufactured from a powder mixture with a composition of about 6.09 wt % Ni, 1.02 wt % Fe, 0.039 wt % Co, 1.80 wt % Ti, 2.69 wt % Ta, 0.41 wt % Nb, 0.09 wt % N and balance WC. The powder mixture was milled, dried, pressed and sintered at 1450° C. The sintered cemented carbide substrates comprised a binder enriched surface zone from the substrate surface and to a depth of about 30 μm into the body being essentially free from cubic carbides as measured in a light optical microscope. The amount carbon in the powder was about 6.07 wt %, while the amount carbon as measured in chemical analysis of the sintered cemented carbide was about 5.87 wt %. The sintered cemented carbide comprised about 0.4 wt % Co, 1.0 wt % Fe and 5.9 wt % Ni. The Co originated mainly from the milling bodies that were worn during the milling step. No free graphite or eta phase was visible in a SEM micrograph of a cross section of the cemented carbide substrates.

As a reference, Co-containing cemented carbide substrates were manufactured from a powder mixture with a composition of about 7.20 wt % Co, 1.80 wt % Ti, 2.69 wt % Ta, 0.41 wt % Nb, 0.09 wt % N and balance WC. The powder mixture was milled, dried, pressed and sintered at 1450° C. The sintered cemented carbide substrates comprised a Co enriched surface zone from the substrate surface and to a depth of about 23 μm into the body being essentially free from cubic carbides as measured in a light optical microscope. The sintered cemented carbide substrates comprised about 7.2 wt % Co. No free graphite or eta phase was visible in a SEM micrograph of a cross section of the cemented carbide substrates.

CVD Deposition

CVD coatings were deposited on the two cemented carbide compositions and a summary of the samples is given in Table 1. Prior to the coating deposition every substrate was cleaned in a gentle blasting step to remove the outermost metal from the surfaces.

TABLE 1

Summary of samples

| Sample | Substrate binder | TiN-1 | TiN-2 | TiN total [μm] | TiCN [μm] | bonding layer [μm] | α-$Al_2O_3$ [μm] |
|---|---|---|---|---|---|---|---|
| Invention 1 (CNMG) | NiFeCo | Yes | Yes | 0.4 | 8.9 | — | — |
| Reference 1A (CNMG) | Co | Yes | Yes | 0.4 | 9.5 | — | — |
| Reference 1B (CNMG) | NiFeCo | No | Yes | 0.4 | 9.5 | — | — |
| Reference 1C (CNMG) | Co | No | Yes | 0.4 | 10.2 | — | — |
| Invention 2 (CNMG) | NiFeCo | Yes | Yes | 0.3 | 7.1 | 0.8 | 5.5 |
| Reference 2A (SNMA) | Co | Yes | Yes | 0.5 | 7.5 | 0.7 | 5.2 |
| Reference 2B (CNMG) | NiFeCo | No | Yes | 0.8 | 8 | 1.1 | 5.2 |
| Reference 2C (SNMA) | Co | No | Yes | 0.3 | 8.4 | 0.9 | 5.4 |
| Invention 3 (CNMG) | NiFeCo | Yes | Yes | 0.4 | 8.2 | 0.8* | 4.6 |
| Reference 3A (SNMA) | Co | No | Yes | 0.4 | 8.4 | 0.9* | 5.4 |

*bonding layer deposition with increased $N_2$ partial pressure

Before starting the CVD deposition the CVD chamber was heated up to reach 885° C. For samples Invention 1 and References 1A, 1B, 1C this pre-heating step was performed at 200 mbar and in 100 vol % $N_2$ from room temperature up to 600° C., and from 600° C. up to 885° C. in 100 vol % $H_2$. For the samples Inventions 2, 3 and References 2A, 2B, 2C, 3A the pre-heating step was performed at 1000 mbar and in 100 vol % $H_2$.

The substrates were first coated with an about 0.4 μm thick TiN-layer at 885° C. Two alternative depositions of TiN were performed, with or without an initial step of TiN-1. The aim of the TiN-1 step is to prevent intermetallic phases such as $Ni_3Ti$ from forming in the CVD coating and at the substrate-coating interface. During the TiN-1 deposition the $N_2$ partial pressure was high and the $H_2$ partial pressure was low, and HCl was added, as compared to the TiN-2 deposition step which was performed without HCl and with a 50/50 relation for the $H_2$/$N_2$ gasses. When the TiN-1 was deposited, the subsequent TiN-2 deposition time was adapted to reach a total TiN layer thickness of 0.4 μm. The TiN-1 deposition was run for 150 minutes.

Thereafter an approximately 8 μm TiCN layer was deposited by employing the well-known MTCVD technique using $TiCl_4$, $CH_3CN$, $N_2$, HCl and $H_2$ at 885° C. The volume ratio of $TiCl_4$/$CH_3CN$ in an initial part of the MTCVD deposition of the TiCN layer was 6.6, followed by a period using a ratio of $TiCl_4$/$CH_3CN$ of 3.7. The details of the TiN and the TiCN deposition are shown in Table 2.

TABLE 2

| MTCVD of TiN and TiCN | | | | | | |
|---|---|---|---|---|---|---|
| | MT CVD of TiN and TiCN (885° C.): | | | | | |
| | Pressure [mbar] | $H_2$ [vol %] | $N_2$ [vol %] | HCl [vol %] | $TiCl_4$ [vol %] | $CH_3CN$ [vol %] |
| TiN-1 | 400 | 10.5 | 87.4 | 0.88 | 1.25 | — |
| TiN-2 | 400 | 48.8 | 48.8 | — | 2.44 | — |
| TiCN inner | 55 | 59.0 | 37.6 | — | 2.95 | 0.45 |
| TiCN outer | 55 | 81.5 | 7.8 | 7.8 | 2.38 | 0.65 |

After the deposition of the TiCN outer layer the temperature was increased from 885° C. to 1000° C. in an atmosphere of 75 vol % $H_2$ and 25 vol % $N_2$. In two of the samples, samples Invention 3 and Reference 3A, the gas flow during this temperature increase was 100% nitrogen.

A 1-2 μm thick bonding layer was deposited at 1000° C. on top of the MTCVD TiCN layer by a process consisting of four separate reaction steps. First a HTCVD TiCN step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiN-3) using $TiCl_4$, $N_2$ and $H_2$ at 70 mbar. During the third deposition step some of the gases were continuously changed as indicated by a first start level and a second stop level presented in Table 2. Prior to the start of the subsequent $Al_2O_3$ nucleation, the bonding layer was oxidized for 4 minutes in a mixture of $CO_2$, CO, $N_2$ and $H_2$.

The details of the bonding layer deposition are shown in Table 3.

TABLE 3

| Bonding layer deposition | | | | | | | | | |
|---|---|---|---|---|---|---|---|---|---|
| Bonding layer | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
| Temp. increase | | 75 | 25 | | | | | | |
| HTCVD TiCN | 400 | 67.9 | 25.5 | 3.4 | 1.7 | — | 1.55 | — | — |
| TiCNO-1 | 70 | 83.7 | 12.0 | — | 1.2 | 1.2 | 1.5 | 0.40 | — |
| TiCNO-2 | 70 | 63.1-61.1 | 31.5-30.6 | — | — | 1.6-4.6 | 3.15-3.06 | 0.65-0.63 | — |
| TiN-3 | 70 | 64.5 | 32.3 | — | — | — | 3.23 | — | — |
| Oxidation | 55 | 53.8 | 30 | — | — | 12.5 | — | — | 3.7 |

For samples Invention 3 and Reference 3A, an increased $N_2$ partial pressure was applied during the deposition of the bonding layer, see Table 4.

TABLE 4

| Bonding layer deposition of samples Invention 3 and Reference 3A | | | | | | | | | |
|---|---|---|---|---|---|---|---|---|---|
| Bonding layer | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
| Temp. increase | | | 100 | | | | | | |
| HTCVD TiCN | 400 | 56.43 | 38.21 | 2.82 | 1.25 | — | 1.29 | — | — |
| TiCNO-1 | 70 | 73.17 | 23.09 | — | 1.2 | 1.05 | 1.3 | 0.35 | — |
| TiCNO-2 | 70 | 52.98-51.61 | 42.5-41.41 | — | — | 1.32-3.87 | 2.65-2.58 | 0.54-0.53 | — |
| TiN-3 | 70 | 49.92 | 47.59 | — | — | — | 2.50 | — | — |
| Oxidation | 55 | 53.8 | 30 | — | — | 12.5 | — | — | 3.7 |

On top of the bonding layer an α-$Al_2O_3$ layer was deposited. All the α-$Al_2O_3$ layers were deposited at 1000° C. and 55 mbar in two steps. The first step using 1.2 vol-% $A101_3$, 4.7 vol-% $CO_2$, 1.8 vol-% HCl and balance $H_2$ giving about 0.1 μm α-$Al_2O_3$ and a second step as disclosed below giving a total α-$Al_2O_3$ layer thickness of about 5 μm.

The second step of the $\alpha$-$Al_2O_3$ layer was deposited using 1.16% $AlCl_3$, 4.65% $CO_2$, 2.91% HCl, 0.58% $H_2S$ and balance $H_2$.

Coating Analysis

XRD was used to analyse the TC values of the $\alpha$-$Al_2O_3$ and the TiCN in accordance with the method as disclosed above. The layer thicknesses were analysed in a light optical microscope by studying a cross section of each coating at 1000× magnification and both the bonding layer and the initial TiN layer are included in the TiCN layer thickness, see Table 1. The results from the XRD are presented in Table 5.

TABLE 5

| XRD results | | | | |
|---|---|---|---|---|
| Sample | Substrate binder | TC(0 0 12) of $\alpha$-$Al_2O_3$ | I(0 0 12)/I(0 1 14) of $\alpha$-$Al_2O_3$ | TC(4 2 2) of TiCN |
| Invention 1 (CNMG) | NiFeCo | — | — | 3.88 |
| Reference 1A (CNMG) | Co | — | — | 4.19 |
| Reference 1B (CNMG) | NiFeCo | — | — | 3.40 |
| Reference 1C (CNMG) | Co | — | — | 4.52 |
| Invention 2 (CNMG) | NiFeCo | 6.62 | 1.11 | 4.19 |
| Reference 2A (SNMA) | Co | 7.53 | 1.63 | 4.17 |
| Reference 2B (CNMG) | NiFeCo | 5.63 | 0.63 | 2.11 |
| Reference 2C (SNMA) | Co | 7.62 | 2.53 | 4.63 |
| Invention 3 (CNMG) | NiFeCo | 7.20 | 1.24 | 4.34 |
| Reference 3A (SNMA) | Co | 7.71 | 2.80 | 4.75 |

The coatings were also analysed using SEM and in EDS to study the grain sizes of the TiCN and to study any Ni presence in the TiN and TiCN layers. The results are present in Table 6.

Figure 9:
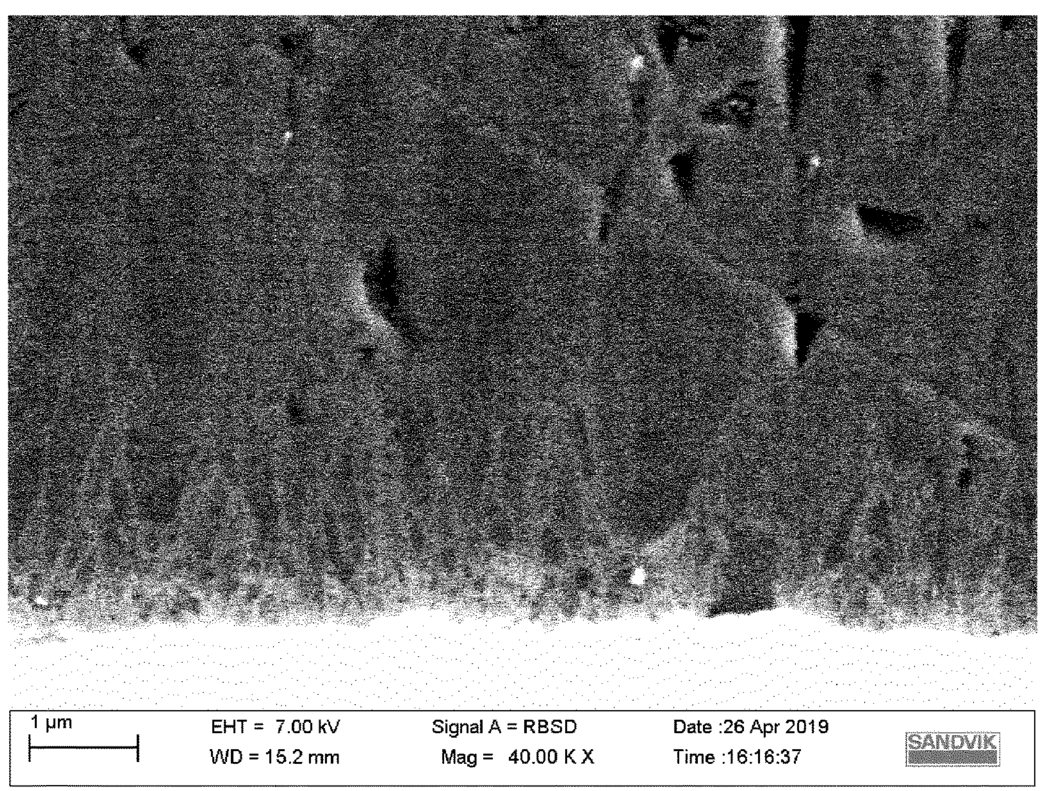
FIG. 9 is a cross-sectional SEM micrograph showing the TiN layer and the lower part of the TiCN layer of a coated cutting tool according to one embodiment of the invention (Invention 2) where the Ni containing grain boundaries are visible as white lines.
Figure 10:
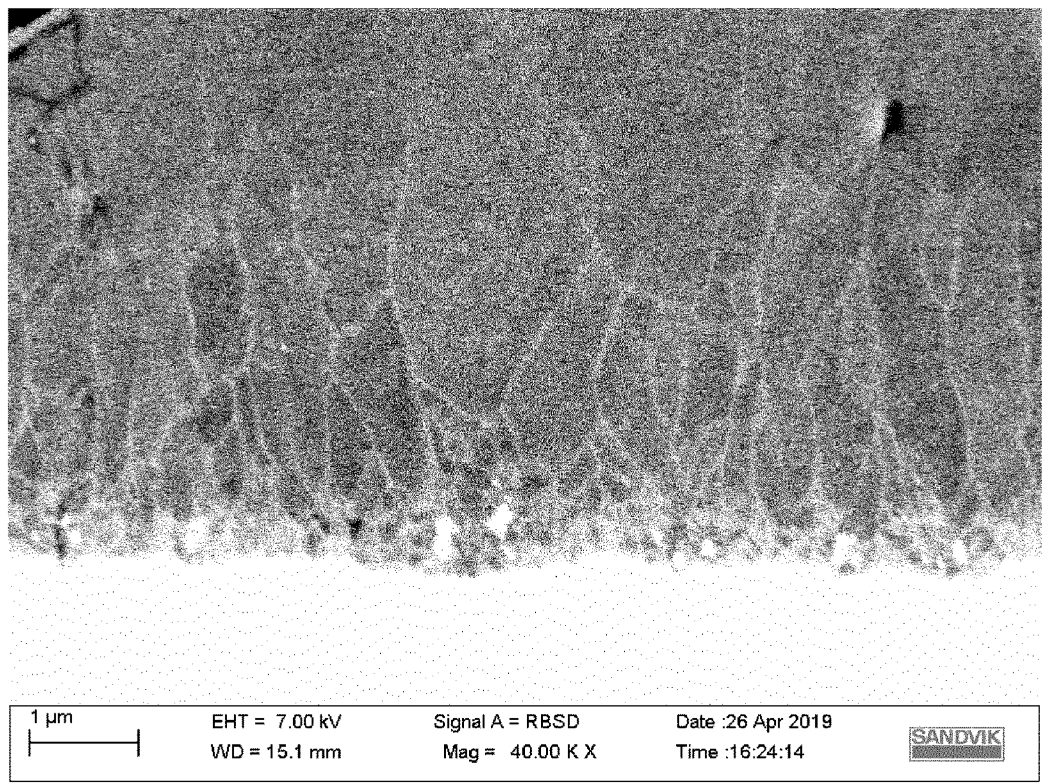
FIG. 10 is a cross-sectional SEM micrograph showing the TiN layer and the lower part of the TiCN layer of a reference coated cutting tool (Reference 2B) where the Ni containing grain boundaries are visible as white lines.

Before SEM/EDS analysis, the as coated inserts were mounted in a black conductive phenolic resin from AKA-SEL which were afterwards ground down 1 mm and then polished in two steps: rough polishing (9 μm) and fine polishing (1 μm) using a diamond slurry solution. The SEM cross section from FIG. 9 and FIG. 10 are viewed in the SEM after this sample preparation procedure. To observe layers microstructure the samples were further polished using a colloidal silica suspension named "MasterPolish 2". The polishing was performed until a scratch free cross section was acquired. The samples were afterwards cleaned with deionized water and detergent to remove residual polishing suspension and dried with clean air spray.

The SEM used for the grain size study a Carl Zeiss AG-Supra 40 type operated at 3 kV acceleration voltage using a 60 μm aperture. The SEM images were acquired at 40.000× magnification and 10 mm working distance. A 9.3 μm long horizontal line was drawn parallel to the substrate and at distance of 1 μm from TiN layer. The grain boundaries crossing the horizontal line were counted and their average size value was calculated and given in the table 6.

The Ni content in TiCN grains was studied with an 80 $mm^2$ X-Max EDX detector mounted in the SEM used for grain size study. The used EDS detector operated using Oxford Instruments "AZtec" software version 3.3 SP1 data acquisition. The measurements were performed by applying the electron beam with 10 kV acceleration voltage and 60 μm aperture on the sample placed at a working distance of 8.2 mm and sequentially acquiring 5 completed framed EDS maps. The EDS map was sized to a of width of 9.5 μm and a height of 7.1 μm a process time 5.

After EDS mapping, linescan measurements were applied in the EDS map data to extract the Ni profile in the TiN/TiCN coating in the first 1.5 to 2.5 μm from the TiN layer/substrate interface. The linescan was to sized to 6.3 μm long and about 1 μm wide. A bining factor was set to 2 to reduce the noise profile.

Figure 5:
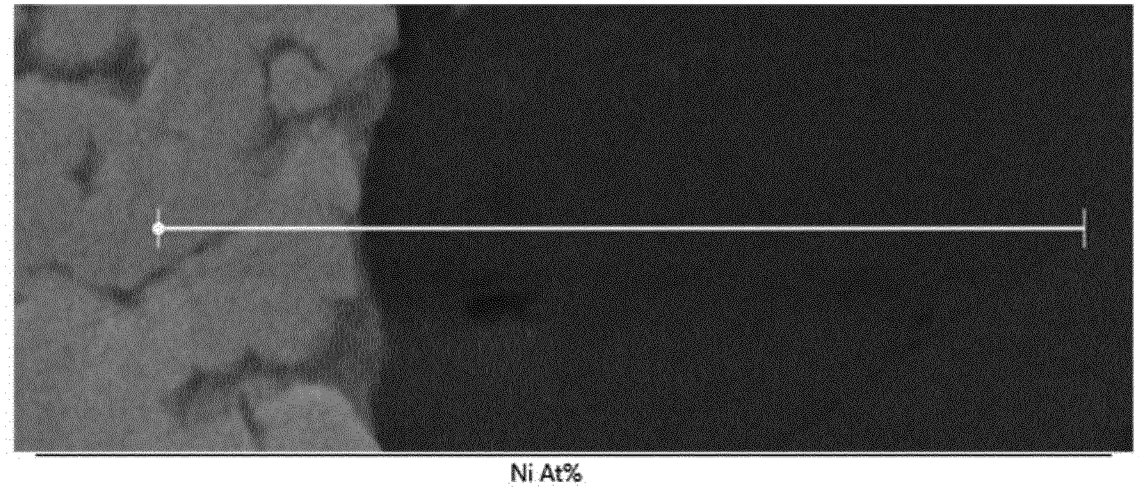
FIG. 5 shows a SEM micrograph and an EDS scan of the Ni content in the cemented carbide-coating interface of the sample Invention 1.
Figure 5:
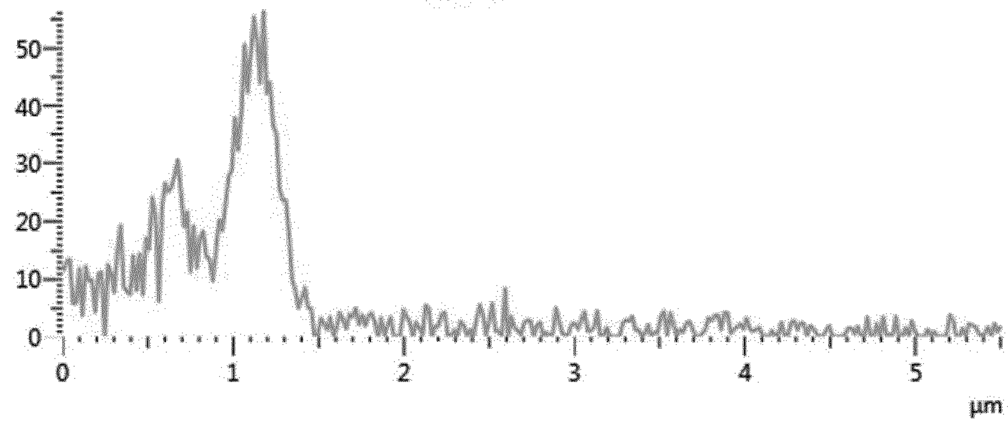
Figure 6:
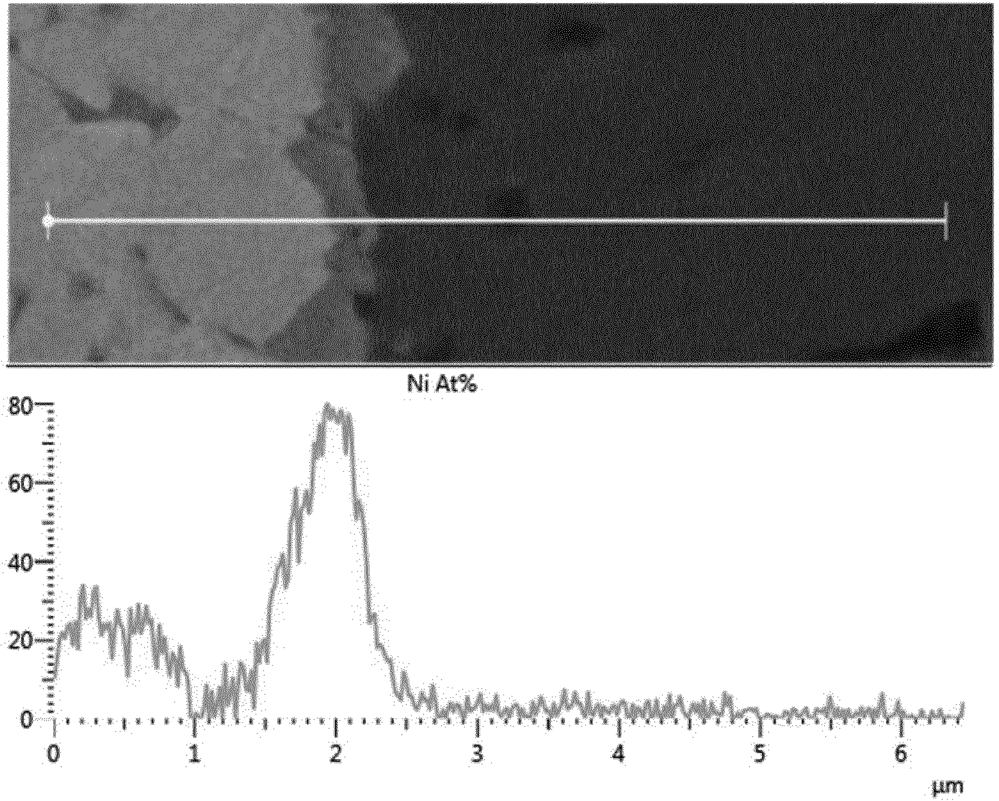
FIG. 6 shows a SEM micrograph and an EDS scan of the Ni content in the cemented carbide-coating interface of the sample Reference 1B.
Figure 7:
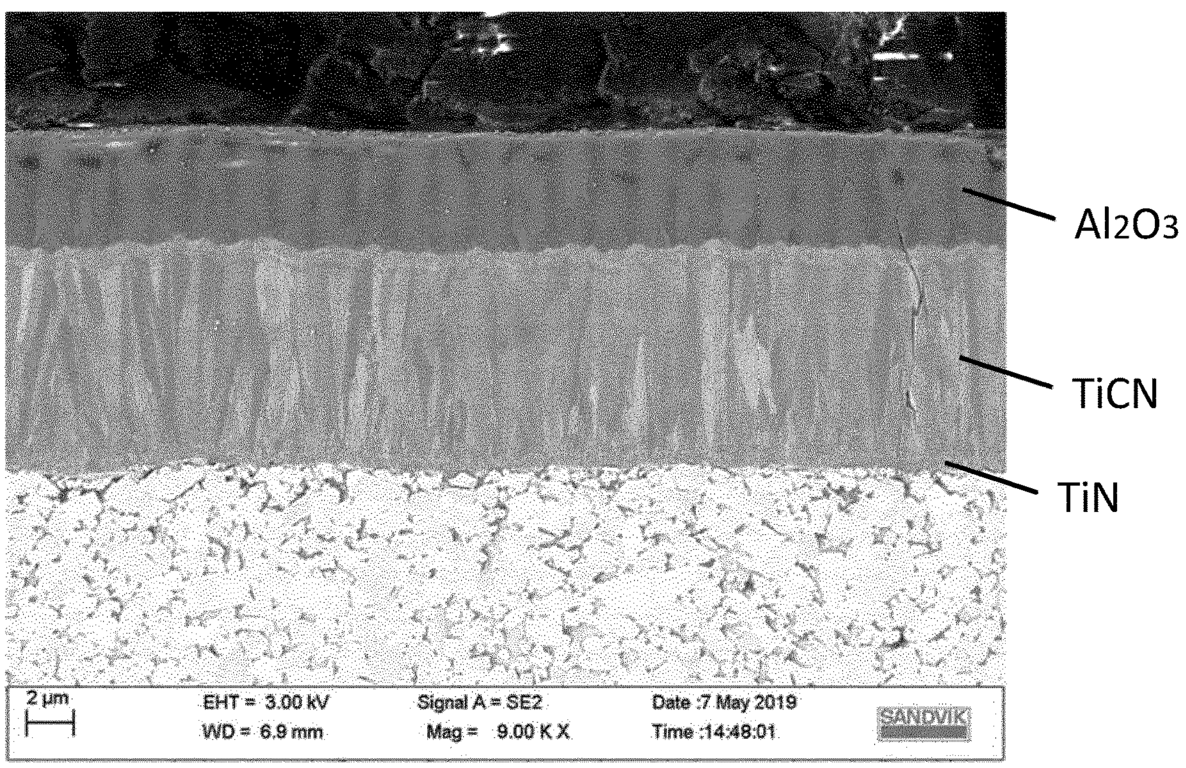
FIG. 7 is a cross-sectional SEM micrograph showing the TiN layer, the TiCN layer, the bonding layer and the $\alpha$-$Al_2O_3$ layer of a coated cutting tool according to one embodiment of the invention (Invention 3)
Figure 8:
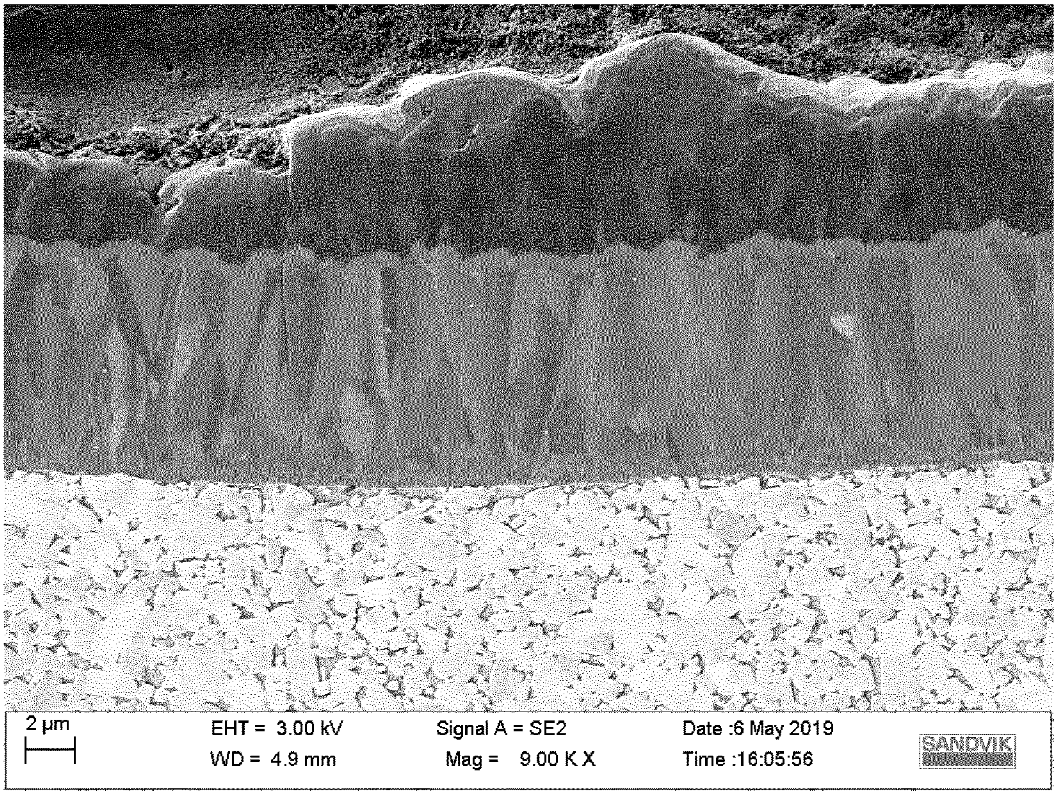
FIG. 8 is a cross-sectional SEM micrograph showing the TiN layer, the TiCN layer, the bonding layer and the $\alpha$-$Al_2O_3$ layer of a reference coated cutting tool (Reference 2B)

Ni profile EDS linescans are shown in FIGS. 5 and 6.

TABLE 6

| Results related to grain size and Ni content | |
|---|---|
| Sample | Average TiCN grain size [μm] |
| Invention 1 (CNMG) | 0.21 |
| Reference 1B (CNMG) | 0.37 |
| Invention 2 (CNMG) | 0.24 |
| Reference 2B (CNMG) | 0.40 |
| Invention 3 (CNMG) | 0.22 |

While the invention has been described in connection with various exemplary embodiments, it is to be understood that the invention is not to be limited to the disclosed exemplary embodiments; on the contrary, it is intended to cover various modifications and equivalent arrangements within the appended claims.

The invention claimed is:

1. A method of making a coated cutting tool, the method comprising chemical vapor deposition of a coating on a substrate, wherein said coating includes an inner layer of TiN, a subsequent layer of TiCN and a $Al_2O_3$ layer located between the TICN layer and an outermost surface of the coated cutting tool, wherein the substrate is made of cemented carbide composed of hard constituents in a metallic binder and wherein the metallic binder includes 60 to 90 wt % Ni, wherein the TiN layer is deposited on the cemented carbide substrate in two subsequent steps at a temperature of about 850-900° C. and a pressure of about 300-600 mbar: a first TiN deposition of TiN-1, followed by a second TiN deposition of TiN-2, the TiN-1 deposition being performed in a gas having 1-1.5 vol % $TiCl_4$ and $H_2$ and $N_2$, wherein the volume ratio $H_2/N_2$ is 0.05-0.18, and wherein the gas includes 0.5-1.5 vol % HCl, and the TiN-2 deposition is performed in a gas having 2-3 vol % $TiCl_4$ and $H_2$ and $N_2$, wherein the volume ratio $H_2/N_2$ is 0.8-2.5.

2. The method of claim 1, wherein the layer of TiCN is deposited in two subsequent steps at a temperature of about 875-895° C. and a pressure of about 50-70 mbar: a first deposition of TiCN, followed by a second deposition of TiCN, the first TiCN deposition is performed in gas having 55-65 vol % $H_2$, 35-40 vol % $N_2$, 2.8-3.1 vol % $TiCl_4$ and 0.4-0.5 vol % $CH_3CN$, and the second TiCN deposition is performed in a gas having 75-85 vol % $H_2$, 6-9 vol % $N_2$, 2.3-2.5 vol % $TiCl_4$, 0.6-0.7 vol % $CH_3CN$ and 7-9 vol % HCl.

3. The method of claim 1, wherein the method further comprises deposition of a layer of $Al_2O_3$ between the TiCN layer and the outermost surface of the coated cutting tool, said deposition of $Al_2O_3$ being performed in at least two steps, both steps at a temperature of 980-1020° C. and a pressure of 50-60 mbar, wherein a first step is performed in a gas composition of 1.1-1.3 vol % $AlCl_3$, 4.5-5 vol % CO2, 1.6-2.0 vol % HCl and the rest $H_2$, and wherein a subsequent second step is performed in a gas composition of 1.1-1.3 vol % $AlCl_3$, 4.5-5 vol % $CO_2$, 2.8-3.0 vol % HCl, 0.55-0.6 vol % $H_2S$ and the rest $H_2$.

4. The method of claim 1, wherein the metallic binder includes 10-20 wt % Fe, and/or 65-88 wt % Ni, and/or 3-8 wt % Co.

5. The method of claim 1, wherein the metallic binder content in the cemented carbide is 3-20 wt %.

* * * * *